United States Patent
Reo

[11] Patent Number: 5,928,569
[45] Date of Patent: Jul. 27, 1999

[54] SUBSTANTIALLY UNIFORM MOLDABLE BLENDS OF SILVER PARTICULATE AND ORGANOPOLYSILOXANE

[75] Inventor: Ned J. Reo, Saratoga Springs, N.Y.

[73] Assignee: Specialty Silicone Products, Inc., Ballston Spa, N.Y.

[21] Appl. No.: 08/806,200

[22] Filed: Feb. 26, 1997

[51] Int. Cl.$^6$ .................................................. H01B 1/22
[52] U.S. Cl. .................................. 252/514; 106/1.19
[58] Field of Search ........................ 252/514; 528/12, 528/15, 32; 264/104; 106/1.19

[56] References Cited

U.S. PATENT DOCUMENTS

| | | | |
|---|---|---|---|
| 3,576,387 | 4/1971 | Derby | 174/36 |
| 3,884,866 | 5/1975 | Jeram et al. | 260/32.85 B |
| 4,032,502 | 6/1977 | Lee et al. | 260/37 SB |
| 4,695,404 | 9/1987 | Kwong | 252/514 |
| 4,766,176 | 8/1988 | Lee et al. | 525/100 |
| 4,777,205 | 10/1988 | La Scola et al. | 524/440 |
| 4,929,391 | 5/1990 | Kroupa | 252/511 |
| 4,956,203 | 9/1990 | Kroupa | 427/221 |
| 5,075,038 | 12/1991 | Cole et al. | 252/514 |
| 5,227,093 | 7/1993 | Cole et al. | 252/512 |
| 5,229,037 | 7/1993 | Nakano et al. | 252/512 |
| 5,236,629 | 8/1993 | Mahabadi et al. | 252/511 |
| 5,266,109 | 11/1993 | Voelker et al. | 106/459 |
| 5,344,593 | 9/1994 | Chiba et al. | 252/514 |
| 5,498,644 | 3/1996 | Reo | 523/218 |
| 5,518,663 | 5/1996 | LaBranche et al. | 252/514 |
| 5,543,457 | 8/1996 | Lewis et al. | 524/736 |
| 5,547,610 | 8/1996 | Mortensen | 252/514 |
| 5,674,966 | 10/1997 | McDermott et al. | 528/32 |

*Primary Examiner*—Mark Kopec
*Attorney, Agent, or Firm*—Schmeiser, Olsen & Watts

[57] ABSTRACT

A method is provided for blending silver powder with a platinum catalyzed heat curable silicone mixture to make a moldable silicone mixture having an indefinite shelf life. Useful conductive silicone articles, such as EMI shielding, can be made having a volume resistivity (milliohms-cm) value of about 2 or less.

7 Claims, No Drawings

SUBSTANTIALLY UNIFORM MOLDABLE BLENDS OF SILVER PARTICULATE AND ORGANOPOLYSILOXANE

BACKGROUND OF THE INVENTION

1. Field of the Invention

The present invention relates to a method for making silicone rubber compositions which can be molded to produce electrically conductive articles such as electromagnetic interference (EMI) shielding. More particularly, the present invention relates to a method of blending curable silicone compositions with metal particulate, such as silver powder, to form injection moldable silicone blends capable of being stored for an indefinite period of time at ambient temperatures.

2. Background of the Invention

Conductive plastic materials comprising finely divided metal within a plastic matrix have been used to a considerable extent. For example, a heat-shrinkable article comprising a layer of finely divided metal filled plastic is described by Derby, U.S. Pat. No. 3,576,387. The metal filled plastic is used in combination with a heat shrinkable plastic to produce an electromagnetic shield for electrical conductors. Kwong, U.S. Pat. 4,695,404, is directed to conductive compositions consisting of a polymeric material filled with from 70 to 90 percent by weight of silver particles.

Cole et al U.S. Pat. Nos. 5,075,038 and 5,227,093 are directed to electrically conductive silicone compositions comprising a silicone polymer, or an organopolysiloxane convertible to a cured material by reaction with a curing agent, and an amount of silver particles sufficient to render the respective silicone compositions electrically conductive. Kroupa, U.S. Pat. No. 4,929,391 shows that electrically conductive silicone compositions can be made from polydiorganosiloxane and mixtures of silver and conductive carbon particles.

As shown by the art, various blending and molding procedures are available for making shaped articles such as electromagnetic interference shielding by incorporating a finely divided metal, such as silver, into a plastic or silicone medium. It has been found, however, it is often difficult to produce a molded metal filled plastic product where the metal is substantially uniformly distributed throughout the plastic matrix. As a result, the volume resistivity (milliohms-cm) of certain metal filled molded parts may lack uniformity. In addition, molding procedures for fabricating mixtures of plastic blended with large amounts of finely divided metal are often inadequate.

Efforts to improve the molding procedures of certain silicone curable mixtures are shown by Jeram et al U.S. Pat. No. 3,884,866 and Lee et al U.S. Pat. No. 4,032,502 which are both incorporated herein by reference. Lee et al, moreover, suggest that liquid injection molding can be used with certain silica filled curable silicone mixtures. In liquid injection molding, a two part mixture, for example, a mixture consisting of a Part A and Part B is often used. Part A can comprise a vinyl terminated polydiorganopolysiloxane fluid in combination with a platinum catalyst and an inhibitor. The curing agent, Part B, is generally a silicone fluid and may comprise a source of dimethylhydrogensiloxane units. The respective parts can be stored indefinitely at ambient temperatures. When mixed, however, the blend can be converted to an elastomeric article if injected into a hot mold.

It would be desirable therefor to provide a method for blending particulate silver and a heat curable silicone fluid to produce a substantially uniform mixture suitable for injection molding to fabricate conductive silicone parts. It also would be particularly significant if molded parts fabricated from such mixture of silicone fluid and finely divided metal exhibited a volume resistivity (milliohms-cm) value of about 2 or less.

SUMMARY OF THE INVENTION

The present invention is based on the discovery that conductive silicone parts having a volume resistivity (milliohms-cm) value of about 2 or less can be made by injection molding a mixture of particulate silver in the form of powder, or flake and a silicone fluid. The silicone fluid can be a mixture consisting of Part A and Part B as previously defined. In addition, prior to injection molding, Part A and/or Part B can be initially contacted with the particulate silver separately, or as a blend.

STATEMENT OF THE INVENTION

There is provided by the present invention, a method for making a substantially uniform blend of silver powder and a one part heat curable silicone fluid mixture to form a moldable silicone composition convertible upon cure to conductive silicone parts having a volume resistivity (milliohms-cm) value of about 2 or less, which method comprises, (1) incrementally adding silver powder to a one part heat curable silicone fluid mixture while it is being agitated at a rate sufficient to maintain a substantially uniform mixture, and (2) continuing to incrementally add the silver powder to the resulting silicone fluid-silver powder blend while it being agitated until there is obtained a moldable material capable of being injected into a hot mold with pressures up to about 20,000 psi, which moldable material comprises by weight, (A) about 60% to about 90% of silver powder having an average diameter of about 0.5 to about 100 micrometers, and (B) about 10% to about 40% of a one part heat curable silicone fluid mixture comprising by weight, (i) 100 parts of a vinyl containing polydiorganopolysiloxane fluid, (ii) and 1 to 20 parts of a siloxane hydride fluid, and (iii) an effective amount of an inhibited platinum catalyst.

DETAILED DESCRIPTION OF THE INVENTION

The vinyl containing polydiorganopolysiloxane fluid, or "vinylsiloxane" used in the one part heat curable organopolysiloxane fluid mixture of the invention can have a viscosity of from about 100 to 200,000 centipoises at 25° C. and a vinylsiloxy unit content of about 0.05 to about 3.5 mol %. Preferably, the vinylsiloxane is terminated with dimethylvinylsiloxy units and consists essentially of chemically combined dimethylsiloxy units. However, in some instances, the vinylsiloxane can have vinyl in the backbone such as vinylmethylsiloxy units, or may have chemically combined diorganosiloxy units, or terminal triorganosiloxy units having monovalent radicals such as cyanoethyl, trifluoropropyl, phenyl, or mixtures of such radicals with methyl, or other $C_{(1-4)}$ alkyl radicals. Methods for making the vinylsiloxane fluid can be found in Sumpter et al, U.S. Pat. No. 5,331,075 which is incorporated herein by reference.

The siloxane hydride fluid, or cross linker, can have about 0.04 to about 1.4% by weight of chemically combined hydrogen attached to silicon. One form of the siloxane hydride fluid is a "coupler" having terminal diorganohydrogensiloxy units, where the organo radicals are free of olefinic unsaturation, such as vinyl, and can be selected from $C_{(1-4)}$ alkyl, and preferably methyl, and also include phenyl, cyanoalkyl, and haloaryl. The coupler can have a viscosity of from 1 to 500 centipoise at 25° C. The siloxane hydride fluid also can include silicon hydride resins having terminal diorganohydrogensiloxy units combined with $SiO_2$ units where the organo+H to Si ratio can vary from 1.0 to 2.7. In addition, the siloxane hydride fluid also can include linear hydride siloxane having a viscosity of 1 to 1000 centpoises at 25° C. Methods for making the siloxane hydride fluid also can be found in the above referenced Sumpter et al patent.

Platinum catalysts which can be used in the practice of the invention are for example reaction products of an olefin and chloroplatinic acid as shown by Ashby U.S. Pat. No. 3,159,601, or the platinum reaction product with cyclopropane as described by Ashby U.S. Pat. No. 3,159,662. Further examples of platinum catalysts which can be used are shown by Lamoreaux, U.S. Pat. No. 3,220,972. The preferred catalyst is shown by Karstedt, U.S. Pat. No. 3,775,452 formed by reacting chloroplatinic acid and tetramethyldivinyldisiloxane in the presence of sodium bicarbonate in an ethanol solution. Effective cure results of the can be achieved if there is used in the one part heat curable silicone fluid mixture of the present invention, sufficient platinum catalyst to provide from about 1 to about 250 parts of platinum, per million parts of heat curable silicone fluid mixture.

Platinum catalyst inhibitors can be used to extend the pot life of the heat curable silicone fluid mixture to allow it to be blended with silver powder in accordance with the method of the invention. Based on the nature and concentration of the inhibitor, cure of the heat curable silicone mixture can be suppressed at 25° C. for an extended period of time. Activation of the platinum catalyst can be effected at an elevated temperature. Certain inhibitors, such as acetylenic alcohols, for example, 2-methyl-3-butyn-2-ol, have been found to require a temperature of 70° C. or above to cure at a practical rate. Additional inhibitors are cyclic methylvinylsiloxanes. Further examples of inhibitors are shown in Kookootsedes et al., U.S. Pat. No. 3,445,420 and Lee et al. U.S. Pat. No. 3,989,667.

Inhibitor concentrations as low as one mole of inhibitor per mole of platinum will sometimes provide a satisfactory work time without interfering with a desired cure rate at an elevated temperature. In other situations, inhibitor concentrations as high as 500 or more moles of inhibitor per mole of platinum may be required.

In addition to platinum inhibitors, one part heat curable organopolysiloxane compositions can be made using a microencapsulated platinum catalyst as shown by U.S. Pat. No. 5,015,691, incorporated herein by reference. In addition, mixtures of vinyl-substituted organopolysiloxane fluid and a siloxane hydride can be combined with a platinum catalyst to form a part heat curable organopolysiloxane mixture, if the platinum is used as an inclusion compound of a cyclodextrin with a platinum halide complex with a member selected from cyclooctadiene and norbornadiene as shown by U.S. Pat. No. 5,025,073 incorporated herein by reference.

In the practice of the method of the invention, it is preferred to premix Part A, or the vinyl terminated polydiorganopolysiloxane fluid in combination with a platinum catalyst and inhibitor with Part B, or silicone fluid comprising a source of dimethylhydrogensiloxane units, to form a one part heat curable silicone fluid mixture. The expression "one part heat curable silicone fluid mixture" as used hereinafter in the description of the present invention can include in addition to a blend of Part A and Part B, from up to about 10% of silica filler and optional ingredients such as filler treating agents, flame retardant, pigments and heat stabilizers.

Blending of the silicone fluid with the silver powder can proceed with a standard means of agitation such as stirring with a spatula, or the use of a mechanical mixer, such as a dough mixer, Banbury mixer, and compounding mills. Increments of the silver powder can added until full and uniform incorporation is achieved. The one part heat curable silicone fluid mixture can have a viscosity in the range of from about 15,000 centipoises to about 200,000 centipoises at 25° C. After blending with the silver powder, the viscosity of the blend can increase to $700 \times 10^6$ to $900 \times 10^6$ centipoise. Liquid injection molding pressures can vary between about 5000 psi to about 20,000 psi, and preferably about 10,000 psi to 20,000 psi depending upon the dimensions of the resulting fabricated part. While liquid injection molding is often preferred, other forms of molding such as compression molding also has been found to be effective. During the LIM operation, curing can be achieved at temperatures in the range of 140° C. to 200° C., and preferably, 150° C. to 106° C.

Silver powder which can be used in the practice of the invention is available commercially and in the form of solid silver particles and most preferably in the form of flakes. The silver powder can have an average particle size in the range of 0.5 to 100 micrometers.

In order that those skilled in the art will be better able to practice the present invention, the following examples are given by way of illustration and not by way of limitation. All parts are by weight unless otherwise indicated.

EXAMPLE 1

A heat curable silicone mixture is prepared by blending together ingredients obtained from the Silicone Products Dept of GE at Waterford, N.Y. There was blended ten parts of SLE 5300A (Part A), a smooth vinyl containing polydimethylsiloxane fluid having a viscosity of 26000 centipoises at 25° C., an effective amount of a platinum catalyst, and a platinum catalyst inhibitor, with one part of SLE 5300B(PartB), a clear colorless methylhydrogensiloxane fluid having a viscosity of about 1200 centipoises at 25° C. The resulting one part heat curable silicone mixture also contained about 20 to 30 parts of silica filler.

An initial blend of 27 parts of the above heat curable silicone mixture and 73 parts of silver flake having an average diameter of about 5 microns is prepared by adding the silver flake to the heat curable silicone mixture while it is stirred in a dough mixer at ambient temperatures. After 10 minutes, additional silver flake is added while the resulting blend is continuously agitated. The agitation and incorporation of silver flake into the resulting heat curable silicone mixture blend is continued for 15 minutes until there is obtained a moldable mixture having about 73% by weight of silver powder and 27% by weight of heat curable silicone fluid mixture.

A portion of the curable mixture is molded for about 15 to 60 seconds at a temperature of 150° C. to produce a conductive silicone part having a volume resistivity (milliohms-cm) value of about 2 and useful as EMI shielding. It is further found that after a several month shelf period at ambient temperatures, a remaining portion of the moldable mixture also is readily convertible to useful to EMI shielding in accordance with standard injection molding procedures.

EXAMPLE 2

A uniform blend of 65 parts silver flake and 24 parts of parts of SLE 5300A (Part A) of example 1 is formed in a dough mixer. Similarly, a blend of 8 parts of silver flake and 3 parts of SLE 5300B (PartB) of example 1 is made. The respective blends are allowed to rest separately for about six months under ambient conditions. A heat curable uniform mixture is obtained by blending Part A and Part B in a dough mixer.

The resulting silver filled silicone blend is then molded following the procedure of Example 1. There is obtained a useful conductive silicone part suitable as EMI shielding.

What is claimed is:

1. A substantially uniform blend comprising about 60% to about 90% of incrementally added silver particulate and about 10% to about 40% of organopolysiloxane which substantially uniform blend has an indefinite shelf-life at ambient temperatures and can be molded to an electoconductive article having a volume resistivity (millihoms-cm) of about 2 or less wherein said substantially uniform blend is produced by a method comprising incrementally adding said silver particulate to a one part heat curable mixture which is being agitated at a rate sufficient to maintain a substantially uniform blend, and continuing to incrementally add the silver particulate to the resulting blend which is being agitated until there is obtained said substantially uniform blend.

2. A moldable blend in accordance with claim 1, where the silver particulate is silver flake.

3. A moldable blend in accordance with claim 1, where the organopolysiloxane comprises a mixture of a vinyl containing polydiorganopolysiloxane, a siloxane hydride fluid, and an inhibited platinum catalyst.

4. An injection moldable blend in accordance with claim 1.

5. A substantially uniform blend comprising:
   about 60 to about 90 weight percent of incrementally added silver particulate; and
   about 10 to about 40 weight percent of a heat curable silicon fluid, wherein the heat curable silicon fluid includes a vinyl containing polydiorganopolysiloxane fluid, a siloxane hydride fluid, and an effective amount of an inhibited platinum catalyst wherein said substantially uniform blend is produced by a method comprising incrementally adding said silver particulate to a one part heat curable silicone fluid mixture which is being agitated at a rate sufficient to maintain a substantially uniform blend, and continuing to incrementally add the silver particulate to the resulting blend which is being agitated until there is obtained said substantially uniform blend.

6. A moldable blend in accordance with claim 5, where the silver particulate is silver flake.

7. A moldable blend in accordance with claim 5, which can be injection molded to an electroconductive article having a volume resistivity (millohms-cm) of about 2 or less.

* * * * *